United States Patent [19]
Flechsig et al.

[11] Patent Number: 5,423,207
[45] Date of Patent: Jun. 13, 1995

[54] ADVANCED PZT GLIDE HEAD DESIGN AND IMPLEMENTATION FOR A SMALL SLIDER

[75] Inventors: Karl A. Flechsig, Los Gatos; Chih-Kung Lee, Cupertino; Sylvia L. Lee, San Jose; Michael L. McGhee, San Jose; Ullal V. Nayak, San Jose; Timothy C. O'Sullivan, San Jose; Josef Walian, San Jose, all of Calif.

[73] Assignee: International Business Machines Corporation, Armonk, N.Y.

[21] Appl. No.: 174,948

[22] Filed: Dec. 27, 1993

[51] Int. Cl.$^6$ .................. G01B 5/28; H01L 41/113; H01L 41/047; H01L 41/18
[52] U.S. Cl. ......................... 73/104; 73/105; 73/DIG. 4; 310/318; 310/348; 310/365; 310/366
[58] Field of Search ............... 73/104, 105, DIG. 4; 360/103, 104; 310/314, 316, 317, 318, 319, 348, 365, 366, 368

[56] References Cited

U.S. PATENT DOCUMENTS

| | | | |
|---|---|---|---|
| 2,292,886 | 8/1942 | Mason | 310/317 |
| 3,421,109 | 1/1969 | Wiggins et al. | 310/366 |
| 3,863,124 | 1/1975 | Pierce et al. | 310/314 |
| 3,882,332 | 5/1975 | Frymoyer | 310/318 |
| 4,072,936 | 2/1978 | Spirig | 310/319 |
| 4,075,600 | 2/1978 | Sims et al. | 367/155 |
| 4,431,938 | 2/1984 | Inoue | 310/348 |
| 4,634,917 | 1/1987 | Dvorsky et al. | 310/366 |
| 5,282,103 | 1/1994 | Hatch et al. | 360/104 |
| 5,282,190 | 1/1994 | Maruo et al. | 360/105 |
| 5,309,303 | 5/1994 | Hsia et al. | 360/103 |

FOREIGN PATENT DOCUMENTS 1504485  8/1989  U.S.S.R. ............... 73/105

Primary Examiner—Hezron E. Williams
Assistant Examiner—Daniel S. Larkin
Attorney, Agent, or Firm—Ingrid M. Foerster

[57] ABSTRACT

An enhanced piezoelectric sensor for detecting a predetermined bending mode frequency in the vibrational response of a slider with dimensions smaller than the conventional 100% slider during contact with one or more surface asperities on a recording surface. A method for making the enhanced sensor is also disclosed. The sensor comprises a substantiality rectangular slab of piezoelectric material having a charge response which corresponds to in-plane stress under free boundary conditions. Enhancement is achieved by partitioning an upper conductive layer along the lines of symmetry of the slider's stress distribution, which is related to the piezoelectric material's generated charge. In the preferred embodiment, the conductive layer is partitioned into two electrically isolated regions symmetric about the sensor's lateral axis. The design facilitates the isolation of a high frequency bending component which has been found to be monotonic with increasing surface asperity interference.

37 Claims, 17 Drawing Sheets

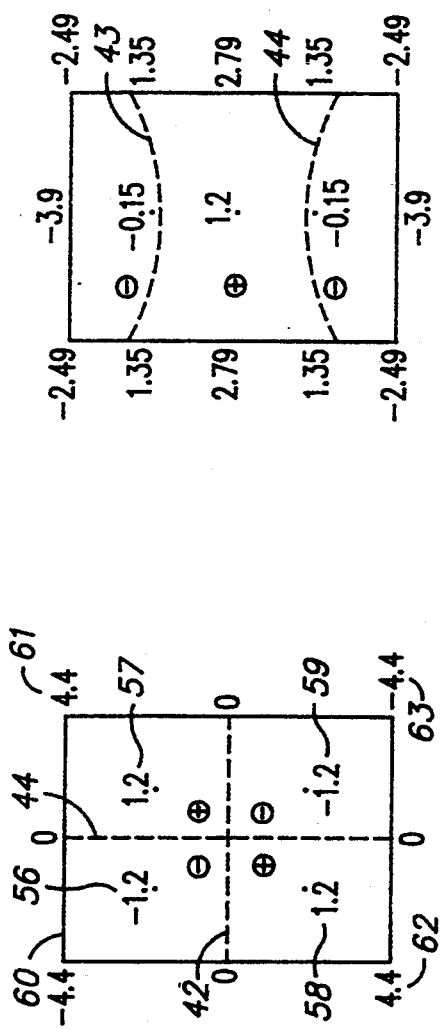
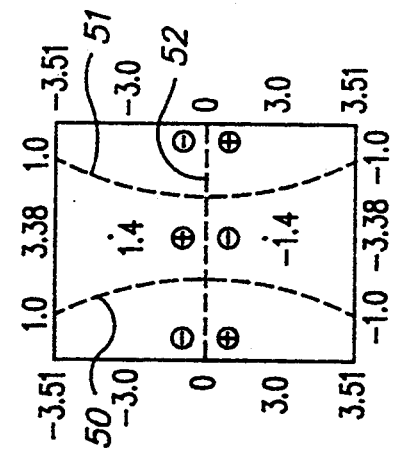
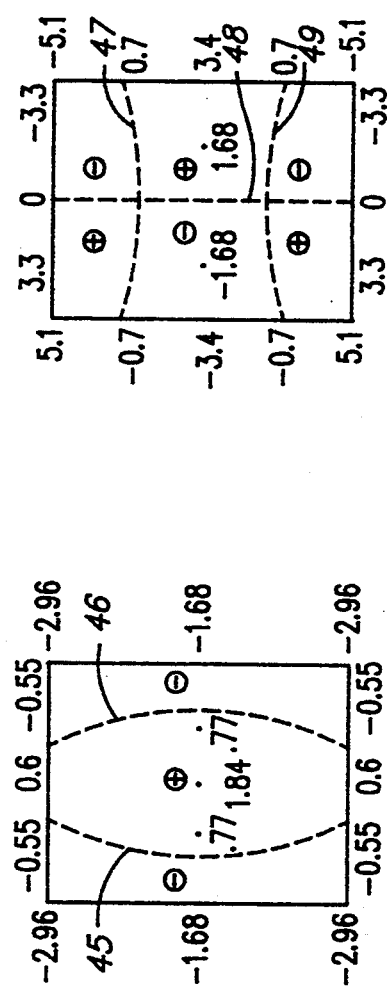

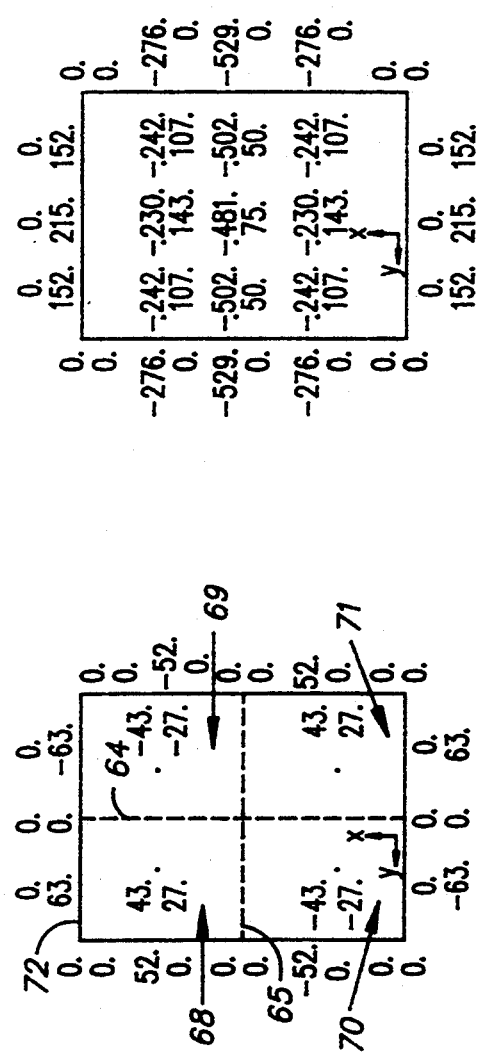
FIG. 5A
FIG. 5B
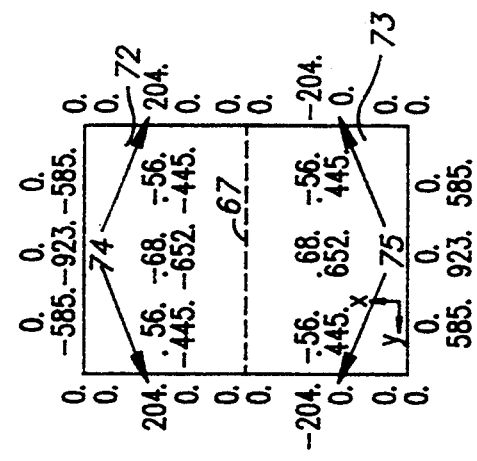
FIG. 5E
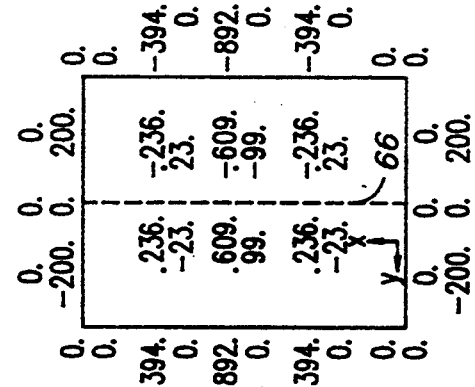
FIG. 5D
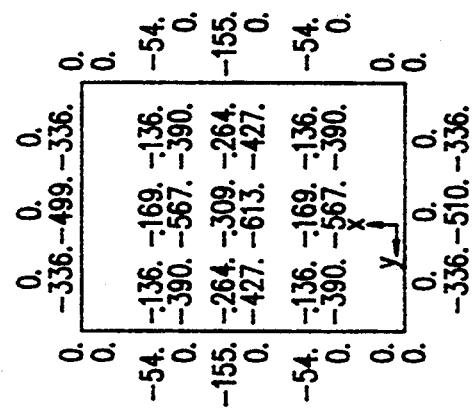
FIG. 5C

ADVANCED PZT GLIDE HEAD DESIGN AND IMPLEMENTATION FOR A SMALL SLIDER

BACKGROUND OF THE INVENTION

1. Field of the Invention

The present invention relates generally to apparatus for performing surface analysis on a recording surface, and in particular, to an optimized piezoelectric contact detection sensor for detecting surface asperities on a magnetic recording disk.

2. Background

In a conventional magnetic storage drive, an air bearing slider supports a magnetic transducer in close proximity to a relatively moving recording surface. The recording surface typically comprises a rigid disk coated with a layer of magnetic material applied by a method such as spin-coating or sputtering. Coated disks must be free of asperities to assure long-term reliability and the data integrity at the head to disk interface, since asperities can lead to undesirable slider-disk contact or "head crash".

Glide height testing is one means for assuring an asperity-free disk. A slider is flown over the recording disk at a height equal to or below the desired data head fly height to analyze impacts between the slider and the disk surface. The slider includes one or more piezoelectric sensors bonded to an upper surface facing away from the recording surface. Piezoelectric materials are used because they generate an electric charge in response to internal stress. As the slider experiences rigid body displacement and flexural deformation, the adjacent sensor responds by generating a charge signal which may be monitored.

A dominant practice in the art has been to monitor the low frequency piezoelectric signals corresponding to rigid body displacement and indicative of slider contact with large asperities on the disk surface. But as sliders decrease in size, magnetic transducers become vulnerable to relatively small asperities. Experience among those skilled in the art has shown a class of asperities (e.g. disk delaminations) that are too small to cause head crashes, yet large enough to result in slider-disk contact adversely affecting device reliability. This class of asperities generates high frequency vibrations in the test slider which cannot be detected adequately by conventional means.

The optimal sensitivity to small disk asperities is obtained by monitoring the high frequency vibrations of a test slider. Yet the high frequency components, or bending mode frequencies, of the response signal may vary greatly. Many modes display a non-monotonic response with increasing asperity interference height, i.e. the distance between the tip of an asperity and the minimum slider fly height. Nonmonotonic modes indicate the occurrence of disk contact but provide no useful information about the size of the asperity causing contact.

The trend in recent years has been to produce storage systems having smaller sliders than the conventional "large" or "100%" sliders (e.g. 4 mm long×3.2 mm wide). Reductions in slider size necessitate a corresponding reduction in test slider dimensions for equivalent compliance to the recording surface. This reduction results in a weaker piezoelectric signal and poor signal-to-noise (S/N) ratio. S/N ratio has also been shown to decrease with decreasing glide height. Thus, optimizing test slider sensitivity becomes increasingly important for smaller slider designs.

U.S. patent application Ser. No. 08/174,484, filed concurrently herewith, discloses a method and apparatus for identifying the high frequency bending mode components of a signal response generated in a test slider during small asperity contact. The application also discloses a method and apparatus for analyzing the identified components to select an optimal monotonic bending mode for increasing asperity interference height, and a method for designing a piezoelectric sensor optimized to detect the identified mode. What is needed is a piezoelectric sensor having optimized sensitivity to a predetermined high frequency bending mode signal generated in a small slider during contact with small surface asperities, and a method for making the same.

SUMMARY OF THE INVENTION

It is therefore an object of the present invention to provide an optimized mode selection sensor for use in surface analysis testing.

It is another object of the present invention to provide a mode selection sensor optimized to detect a predetermined high frequency bending mode.

A further object of the present invention is to provide an optimized mode selection sensor for use in the analysis of small surface asperities in a storage system.

It is a further object of the present invention to provide an optimized mode selection sensor for sliders of dimensions smaller than the conventional 100% slider.

Accordingly, the present invention is an optimized modal sensor for use in surface analysis testing such as that performed on magnetic disk drives. The sensor is designed to detect a particular bending mode frequency which has experimentally been found to display a monotonic response to increasing surface asperity interference (for small asperities). Thus the sensor is able to detect relatively small surface asperities. Also disclosed is the preferred method for making the optimized slider of the present invention.

BRIEF DESCRIPTION OF THE DRAWINGS

The foregoing and other objects, features and advantages of the present invention will be apparent from the following detailed description of the preferred embodiments, with reference to the accompanying figures of the drawings, in which:

FIGS. 4(a)–(e) show the out-of-plane modal displacements of a slider corresponding to five bending mode frequencies;

FIGS. 5(a)–(e) show the surface stresses of a slider corresponding to five bending mode frequencies;

DESCRIPTION OF THE PREFERRED EMBODIMENT

Figure 1:
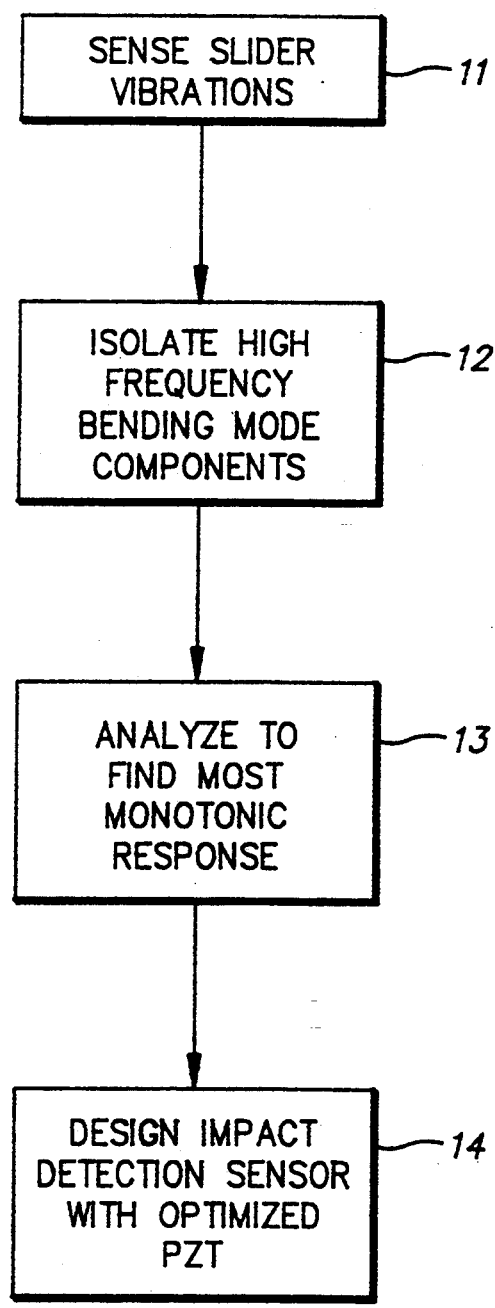
FIG. 1 is a flow diagram showing the steps of the optimizing method of the present invention.

FIG. 1 is a flow diagram of the optimization method used to select the small slider mode selection sensor design of the present invention. In a first step 11, a slider is suspended over a rotating magnetic disk. Contact between the slider and disk is manifested by high frequency slider vibrations, which are transformed into an electrical signal by sensing means such as a piezoelectric sensor. Next 12, the sensed electrical signal is processed to identify its high frequency bending mode components. Once identified, the modes are analyzed over a range of decreasing flying heights to determine the mode(s) displaying the most monotonic response to increasing asperity interference (step 13). The fourth and final step 14 entails designing an interaction detection piezoelectric sensor with enhanced sensitivity to the identified monotonic bending mode component(s).

The foregoing steps shall be described in further detail below.

I. Sensing the Slider Response

Figure 2:
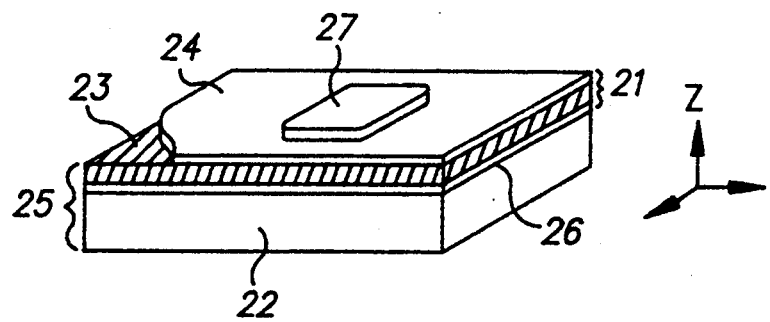
FIG. 2 is a perspective view of a slider mounted with a piezoelectric sensor.

As shown in FIG. 2, slider responses are sensed by a sensing structure 25 comprising a piezoelectric sensor 21 mounted to a slider 22. The sensor 21 includes a thin layer of piezoelectric material 23 coated on each of its two faces with a layer 24, 26 of conductive material. In a preferred embodiment, the piezoelectric material comprises a slab of commercially available PZT-5A plated on each surface with a thin layer of nickel, although it will be understood that other suitable piezoelectric and conductive materials may also be used. One of the layers 26 is bonded to the upper surface of a slider 22. Electrode means 27 are then applied to the other conductive layer 24, e.g. by silver plating. The piezoelectric material 23 generates an electric charge signal in response to internal stresses caused by deformations experienced in the adjacent slider 22. One of the conductive layers 26 is electrically grounded, and the other 24 is electrically coupled to amplifying, processing and monitoring means (not shown).

Figure 3A:
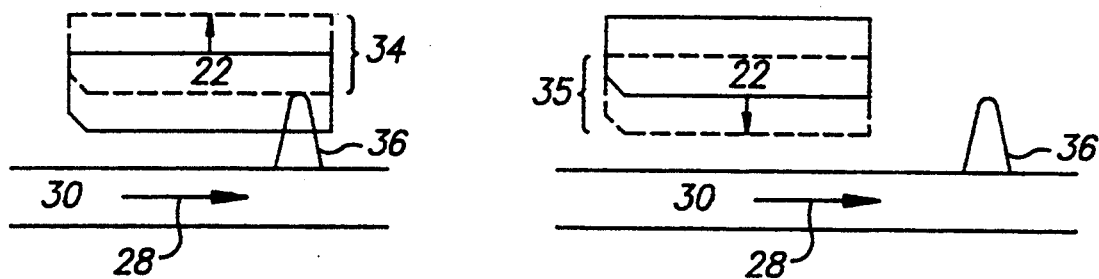
FIG. 3(a) shows the rigid body displacement experienced by a slider due to impact with a surface asperity.
Figure 3B:
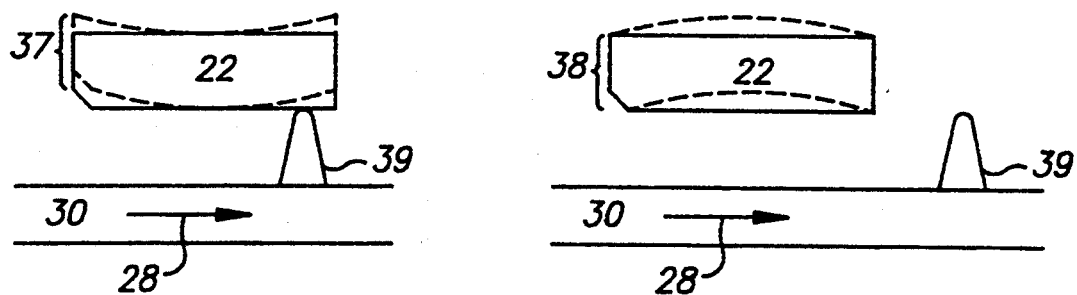
FIG. 3(b) shows the out-of-plane deformations experienced by a slider due to impact with a surface asperity.

FIGS. 3(a) and (b) illustrate two types of displacement experienced by a slider 22 as it flies over the rotating disk 30. The disk 30 is moving relative to the slider 22 in the direction of the arrow 28. Rigid body displacement is indicated by the dashed lines 34, 35 in FIG. 3(a). Such out-of-plane displacement is generally caused by slider impact with a large surface asperity 36 or a change in slider acceleration relative to the disk 30. Flexural deformation or bending is indicated by the dashed lines 37, 38 of FIG. 3(b). Such deformation occurs whenever the slider contacts a large or small asperity. Rigid body motion generally occurs at much lower frequencies than flexural deformation, and as such is not relevant to the present invention. For small asperities, the piezoelectric signal from the flexural deformation is dominant.

FIGS. 4(a)-(e) present finite element simulation results for the displacement corresponding to the lowest order vibration modes in a slider after impact with a disk asperity. Each modeshape shown in FIGS. 4(a)-(e) corresponds to a particular frequency, also called "bending mode" frequency. In each of the figures shown, out-of-plane or normal displacement away from the disk surface (i.e. out of the plane of the page) is indicated by a "+" sign. Similarly, displacement in the direction of the disk surface (i.e. into the page) is shown by a "−" sign. Dashed or modal lines 41-51 delimit regions of positive and negative displacement. Numeric values within each delimited region represent the normalized local displacement of that region at the point shown. For example, in FIG. 4(a), the "1.2" and "+" shown in the upper right-hand region 57 indicates that there is a 1.2 normalized displacement occurring in this position having a normalized displacement away from the disk surface of 1.2. An equal positive displacement occurs at the lower left-hand region 58. Similarly, the "−1.2" and "−" shown in the upper left-hand region indicates that there is a 1.2 normalized displacement toward the disk in this region. An equal negative displacement occurs in the lower right-hand region 59. The value "−4.4" at diagonal corners of the negatively displaced regions 56, 59 tell an observer that each of these regions 56, 59 experiences a normalized displacement of 4.4 at its corner in the direction of the disk surface.

In addition to out-of-plane displacement, the flexural deformations corresponding to the bending mode frequencies of a slider 22 generate in-plane components of surface stress. FIGS. 5(a)–(e) show the surface stresses in the PZT calculated by finite element analysis, corresponding to the out-of-plane bending mode displacements shown in FIGS. 4(a)–(e). Thus each pair of corresponding figures, e.g. FIGS. 4(a) and 5(a), represents a unique flexural bending mode frequency of the slider. Pairs of values corresponding to points shown for each model represent normalized components of stress at that point for a 100% or 'minislider'. For example, a positive vertical coordinate such as "43" in region 68 of FIG. 5(a) indicates a positive stress component $\sigma_x$ along the x-axis. Similarly, a positive horizontal component such as "27" in region 68 indicates a positive stress component $\sigma_y$ along the y-axis. Dashed lines 64–67 emphasize the symmetry of surface stress. It will be understood that the normalized numeric values shown in FIGS. 4(a)–(e) and 5(a)–(e) are exemplary only, and will vary with slider dimensions. For example, the slider may be one of those referred to in the industry as a 70% or 'microslider' (2.8 mm 1×2.2 mm w×0.6 mm h), a 50–63% 'nanoslidser' (2.0–2.5 mm 1×1.7 mm w×0.425 mm h) or a 33–25% 'picoslider' (1.0–1.3 mm 1×1.0 mm w×0.3 mm h). Although normalized values will vary, the directions and symmetry of in-plane and out-of-plane displacements should essentially be the same for other sliders.

Figure 6A:
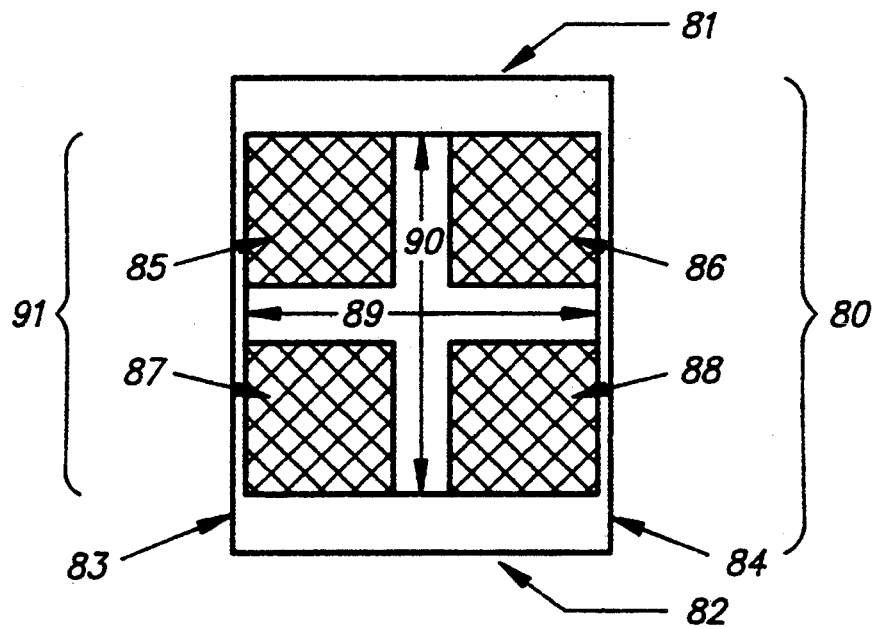
FIGS. 6(a)–(b) are plane and side views, respectively, of the preferred mode selection sensor.
Figure 6B:
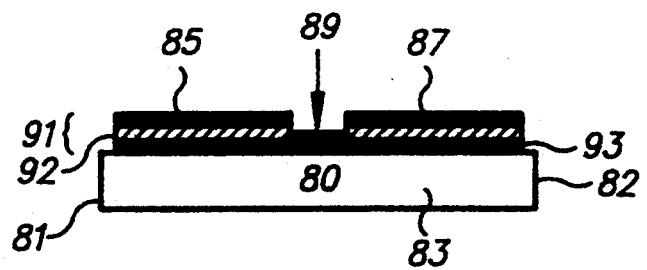
Figure 9:
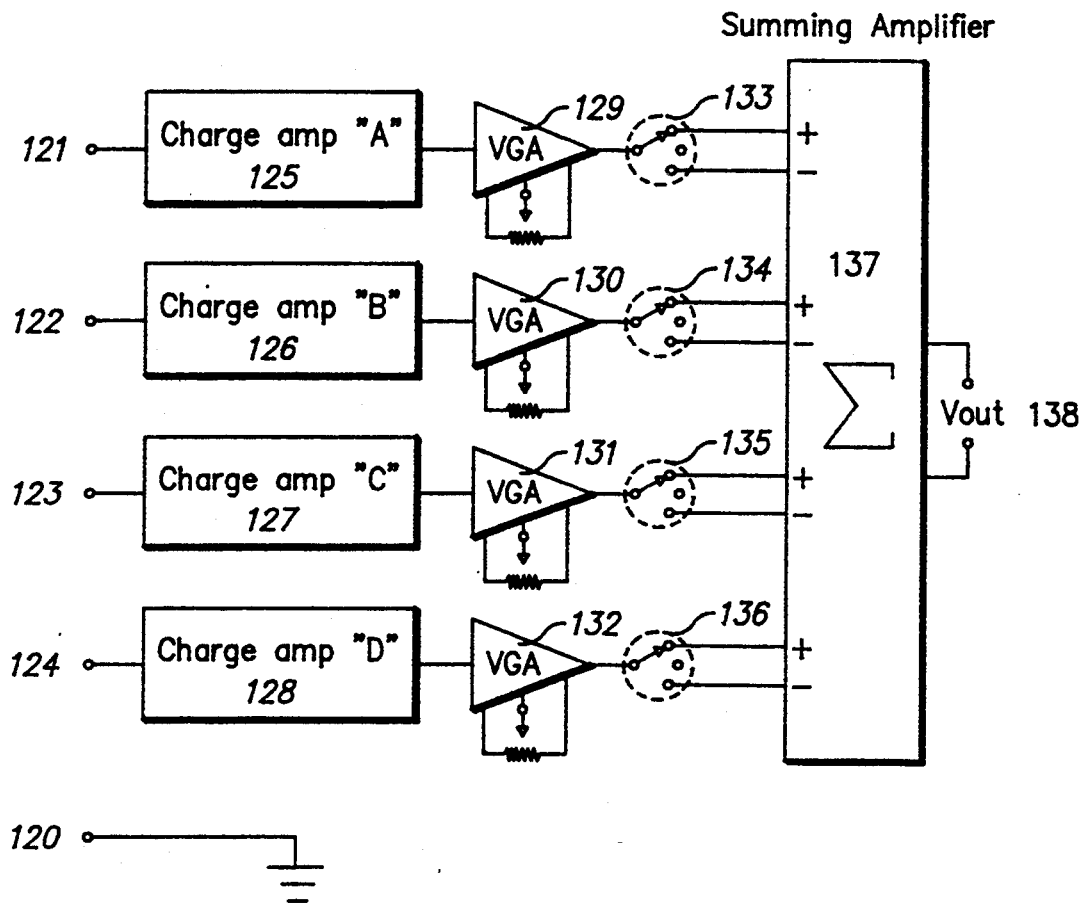
FIG. 9 is a circuit diagram of the preferred signal processing logic used in the method of the present invention.

A preferred embodiment of the mode selection sensor used to isolate bending mode components in a slider response is shown in FIGS. 6(a) and 6(b). A piezoelectric sensor 91 is mounted to a slider 80 having a leading edge 81, a trailing edge 82, a hub side 83 and a rim side 84. The sensor 91 comprises a slab of piezoelectric material 92 such as PZT-5A coated with a continuous layer of conductive material such as nickel on each of its lower and upper surfaces. PZT-5A is preferred because it provides a relatively large charge output compared to other piezoelectric materials such as PVF2. An advantage of this material is the relation of its charge response to the sum of the in-plane stresses ($\sigma_x + \sigma_y$) in the piezoelectric layer. This relationship greatly simplifies the claimed optimization analysis and design process. It should be understood, however, that other piezoelectric materials having similar properties may be used. The lower conductive layer 93 of the sensor 91 is continuous and is electrically grounded to port 120 (FIG. 9). The upper conductive layer is partitioned into four electrically isolated regions 85–88 symmetrical about the lateral and longitudinal axes of the sensor 91. Each quadrant 85–88 is electrically coupled to input ports 121–124 of a charge amplifier (see FIG. 9). The four-quadrant configuration is selected for the PZT-5A sensor because it takes advantage of the symmetries of the in-plane stresses shown in FIGS. 5(a)–(e). In a preferred method, the isolated regions are formed by cutting channels 89, 90 through the conductive layer by a suitable process such as ion milling, chemical etching, reactive ion etching (RIE) or laser ablation. It should be understood that the four-quadrant configuration may also be formed on the piezoelectric material 92 by sputtering or chemical vapor deposition through a mask, silk-screening, or other appropriate means.

Figure 7A:
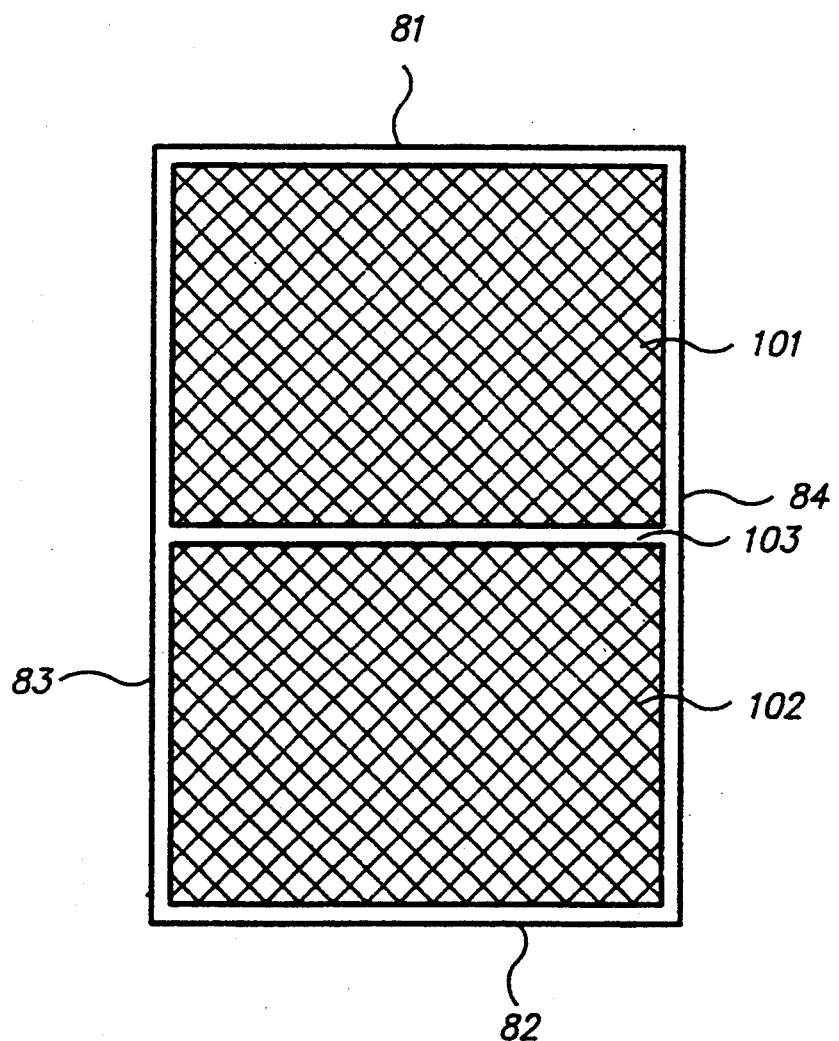
FIG. 7(a)–(b) are plane and side views, respectively, of the preferred mode selection sensor for a slider having space limitations.
Figure 7B:
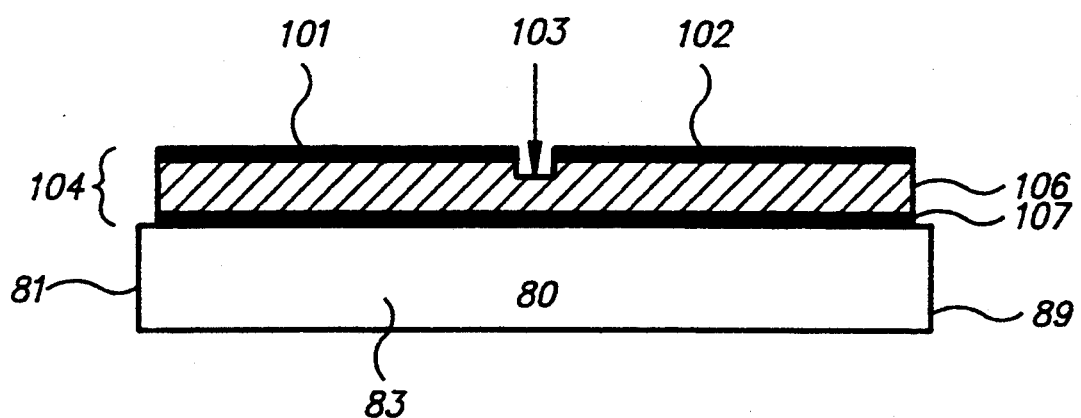

For sliders with limited space, an alternative mode selection sensor is preferred and is shown in FIGS. 7(a) and 7(b). The piezoelectric sensor 104 comprises a slab of piezoelectric material 106 such as PZT-5A coated on its upper and lower surfaces with conductive material such as nickel. The lower layer 107 of conductive material is continuous and electrically grounded. The upper layer comprises two electrically isolated regions 101, 102 formed by cutting a lateral groove 103 into the conductive material and preferably into a portion of the piezoelectric material 106 as well. Each region 101, 102 is coupled to an input port of a charge amplifier 121–122 (FIG. 9).

II. Isolating the Bending Mode Components

The four-quadrant sensor permits separation of the bending modes characterized by FIGS. 4 and 5 by subtraction or summation of the signals generated by each quadrant. For convenience, the quadrants are designated as LEH, LER, TEH and TER, according to their respective proximities to the Leading Edge Hub rail, Leading Edge Rim rail, Trailing Edge Hub rail and Trailing Edge Rim rail.

Figure 8A:
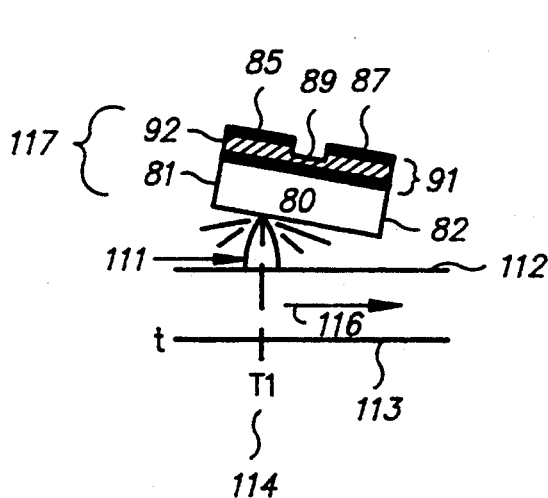
FIG. 8(a) is a side view of the mode selection sensor structure of FIG. 6 at the time of first contact with a surface asperity.
Figure 8B:
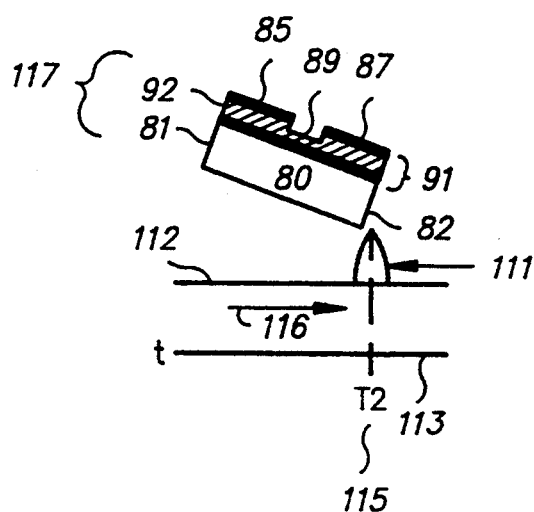
FIG. 8(b) is a side view of the mode selection sensor of FIG. 6 at the time when contact with a surface asperity is lost.

As shown in FIG. 8, the slider 80 and mounted four-quadrant sensor 91 are suspended over a relatively moving recording surface 112 such as a rotating magnetic disk. As the surface 112 moves in the direction indicated by the arrow 116, contact between the slider 80 and a surface asperity 111 causes high frequency vibrations in the entire structure 117. FIG. 8 (a) shows the initial contact at time T1 114, as indicated by a dashed line intersecting the time line 113. FIG. 8 (b) shows the release from contact at time T2 115. The vibrations resulting from the impact cause corresponding charge signals to be generated in the four quadrants of the mode selection sensor 91. These charge signals are electrically connected to signal processing means such as those shown in FIG. 9. For example, the signal processing means of FIG. 9 includes a first stage of charge amplifiers 125–128 for receiving input signals 121–124, each followed by a variable gain amplifier (VGA) 129–132. The input signals 121–124 correspond to the LER, LEH, TER and TEH sensor regions shown in FIG. 6(a). Switching arrangements 133–136 at the summing amplifier input permit the selection of add or subtract mode for each of the four incoming signals 121–124. In the method of the present invention, four independent summing algorithms are used to separate the slider response into its component bending mode signals. The signal combinations are selected by taking advantage of the symmetry of characteristic piezoelectric surface stresses to cancel out unwanted bending mode frequencies.

The four signal combinations of the present method comprise: 1) the difference of the signals of the two diagonal quadrants (LEH−LER−TEH+TER), corresponding to the bending mode response shown in FIG. 5(a); 2) the sum of the signals from all four quadrants (LEH+LER+TEH+TER), corresponding to the bending mode responses of FIGS. 5(b) and (c); 3) the difference of the hub and rim rail signals (LEH−LER+TEH−TER), corresponding to the bending mode response of FIG. 5(d); and 4) the difference of the signals from the leading and trailing end quadrants (LEH+LER−TEH−TER), corresponding to the bending mode response of FIG. 5(e). It shall be understood that the described signal processing may alternatively be performed by a computer program or other suitable means.

Figure 10A:
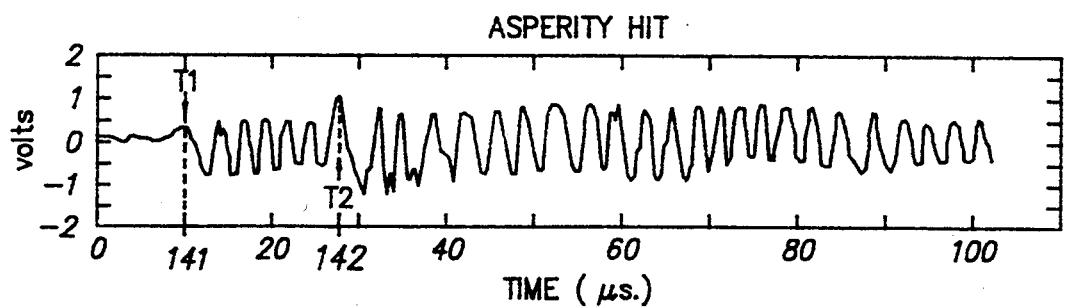
FIGS. 10(a)-(c) represent the slider response to asperity contact, the power spectrum of the response, and the power spectrum of the slider response without asperity contact for the first bending mode of a slider.
Figure 10B:
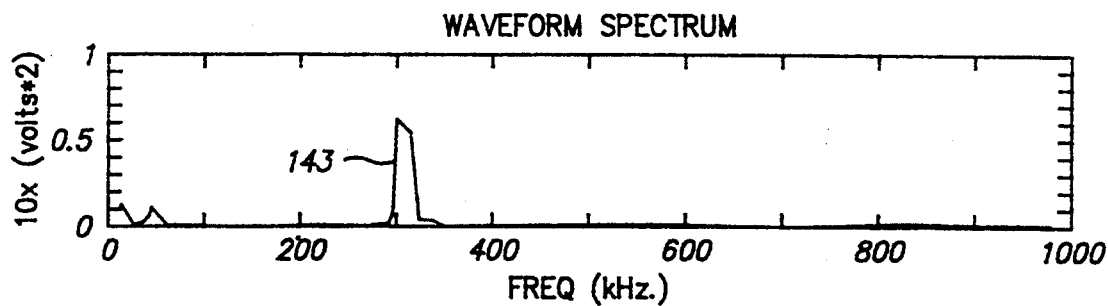
Figure 10C:
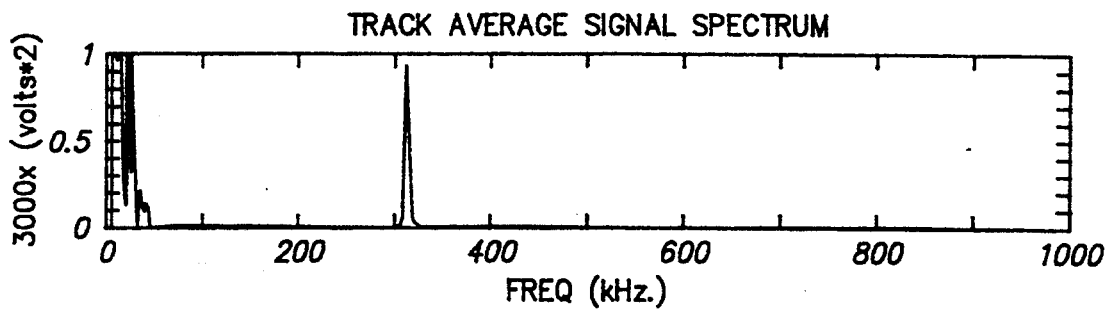

For each summing algorithm, a slider response is sensed during contact with a single robust disk asperity. (See FIG. 8). The processed response at the summing amplifier output 138 may be provided to viewing means such as a monitor. Next, the power spectrum of the output signal is obtained, e.g. by providing the output 138 of the summing amplifier 137 to a power spectrum analyzer. The power spectrum enables one to isolate the bending mode frequency or frequencies corresponding to the summing algorithm. Experimental results for each of the four summing algorithms obtained for a 100% slider are shown in FIGS. 10-13. In each case, a 4-quadrant sensor structure was suspended over a particulate disk with a single, known asperity. As the slider made contact with the asperity, each of the four quadrant responses was provided to processing means such as those of FIG. 9. The processed signal was displayed on a monitor. For example, FIG. 10(a) shows the contact response waveform obtained by taking the difference of the diagonal quadrant signals. Times T1 141 and T2 142, also shown in FIGS. 8(a) and (b), represent the time of initial slider-asperity contact and the time at which the asperity is released at the slider's trailing edge, respectively. The processed signal was then provided to a spectrum analyzer to obtain its power spectral distribution, as shown in FIG. 10(b). In addition, the power spectrum of the slider without contact was obtained for comparison, as shown in FIG. 10(c). In FIG. 10(b), a peak 143 representing the bending mode frequency is found to occur at approximately 300 kHz.

Figure 11A:
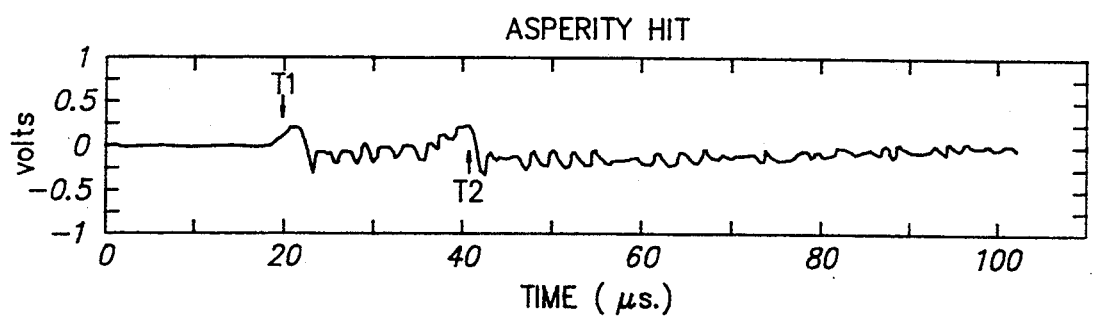
FIGS. 11(a)-(c) represent the slider response to asperity contact, the power spectrum of the response, and the power spectrum of the slider response without asperity contact for the second and third bending modes of a slider.
Figure 11B:
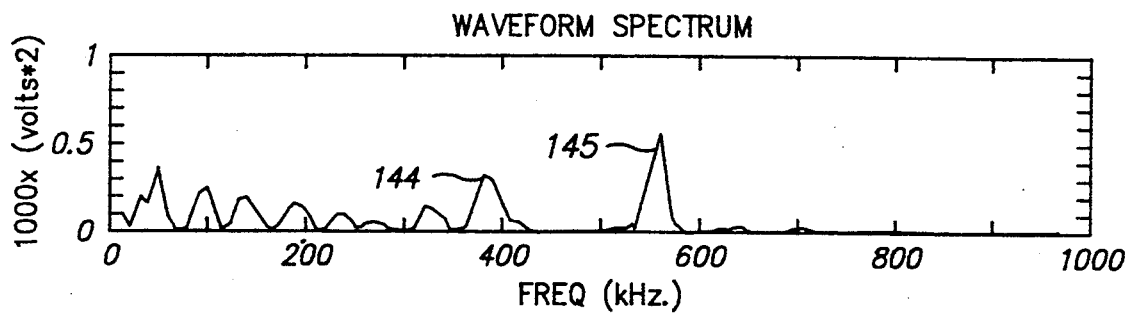
Figure 11C:
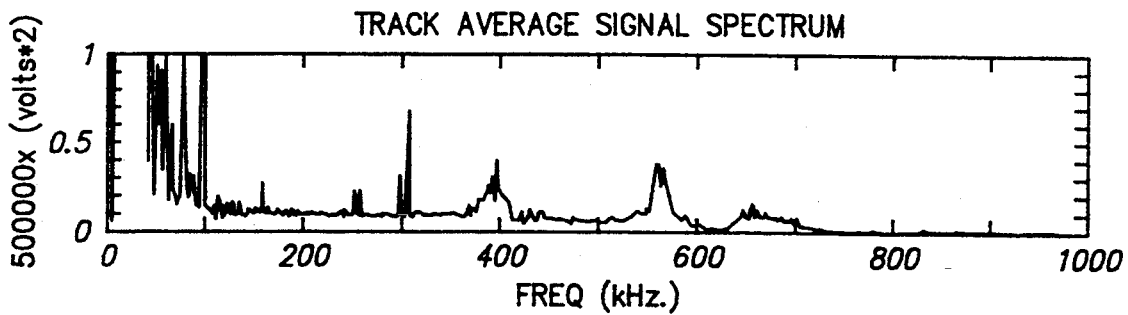
Figure 12A:
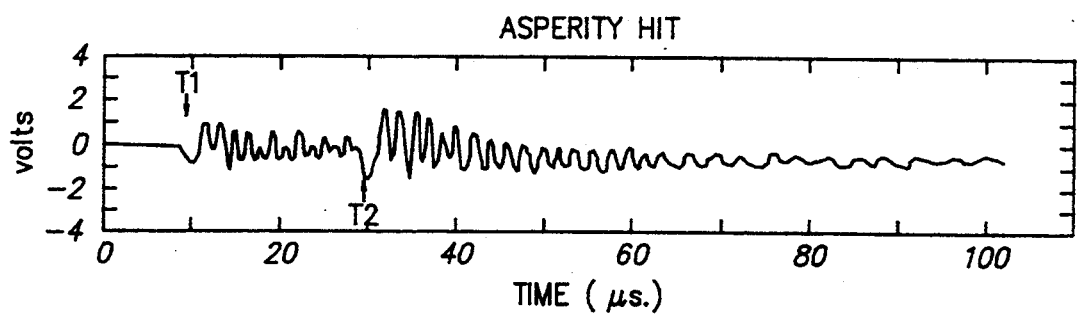
FIGS. 12(a)-(c) represent the slider response to asperity contact, the power spectrum of the response, and the power spectrum of the slider without asperity contact for the fourth bending mode of a slider.
Figure 12B:
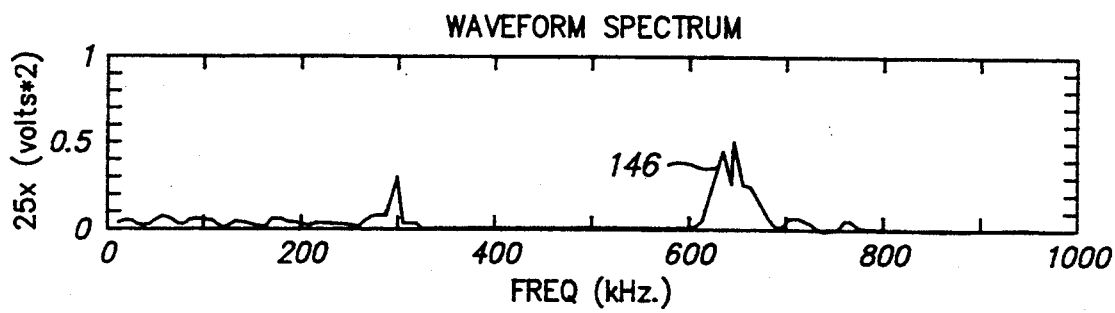
Figure 12C:
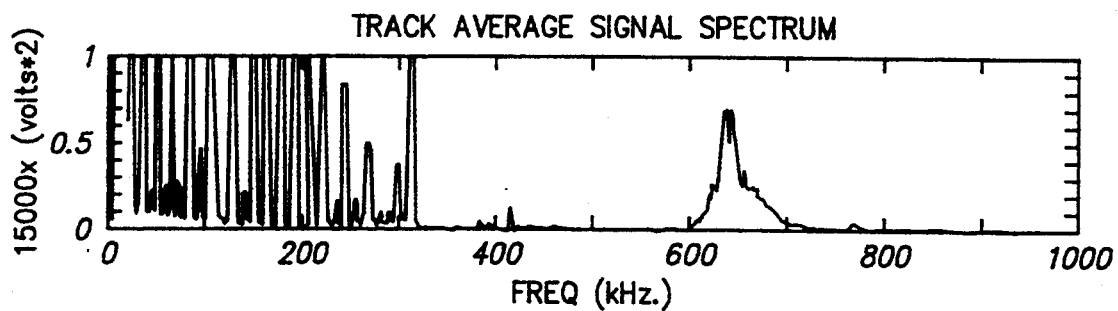
Figure 13A:
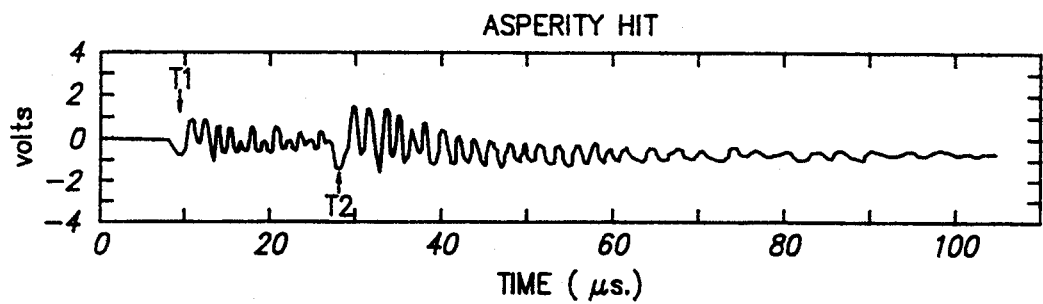
FIGS. 13(a)-(c) represent the slider response to asperity contact, its power spectrum, and the power spectrum of the slider without asperity contact for the fifth bending mode of a slider.
Figure 13B:
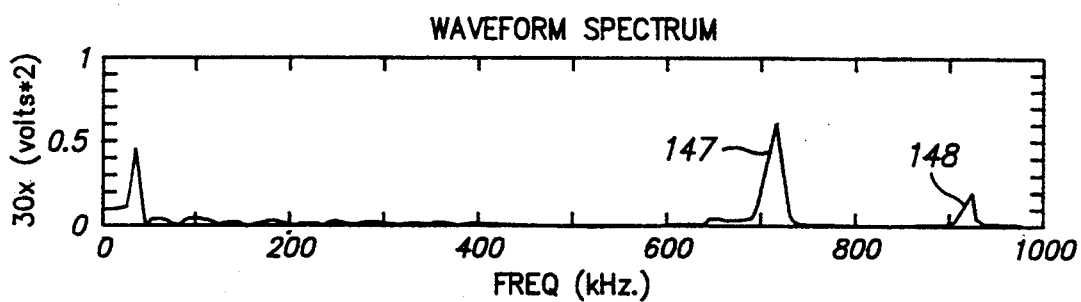
Figure 13C:
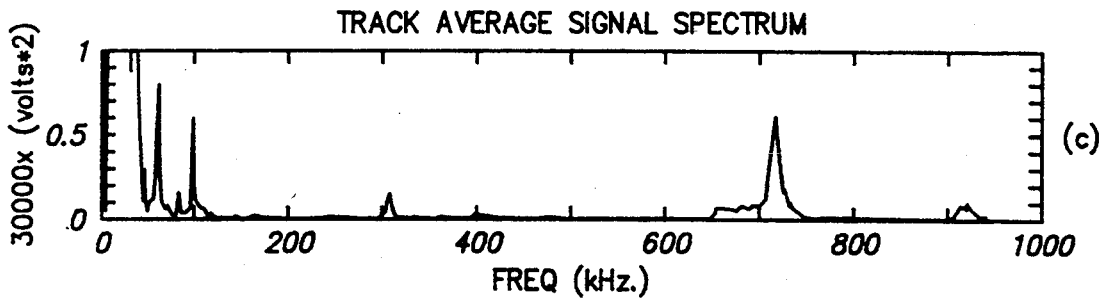

The waveform shown in FIG. 11(a) was obtained by adding the signal contributions of all sensor quadrants. The power spectrum of the waveform in FIG. 11(b) reveals second and third bending mode frequencies 144, 145 of approximately 400 kHz and 550 kHz. Again, the power spectrum of the slider without contact is shown in FIG. 11(c) for reference. FIG. 12(a) represents the slider contact response component found by taking the difference of signals at the slider hub and rim sides. FIGS. 12(b) indicates a fourth bending mode frequency 146 of roughly 640 kHz. Finally, the waveform obtained by taking the difference of the signals at the leading and trailing edges of the slider is shown in FIG. 13(a), and a fifth bending mode frequency 147 of approximately 710 kHz is identified in FIG. 13(b).

For the alternative two-region sensor of FIG. 7, the signal processing is simpler. For convenience, the region proximate to the slider's leading edge 81 is referred to as LE, and the region at the trailing edge 82 is referred to as TE. This slider geometry permits the isolation of bending modes having modal stress profiles showing either no line of symmetry, or symmetry along the slider's lateral axis. For example, the bending mode components characterized by FIG. 5(b) and (c) may be isolated by summing the signals (LE+TE). Subtraction of the signals (LE−TE) isolates the bending mode component characterized by FIG. 5(e).

Figure 14A:
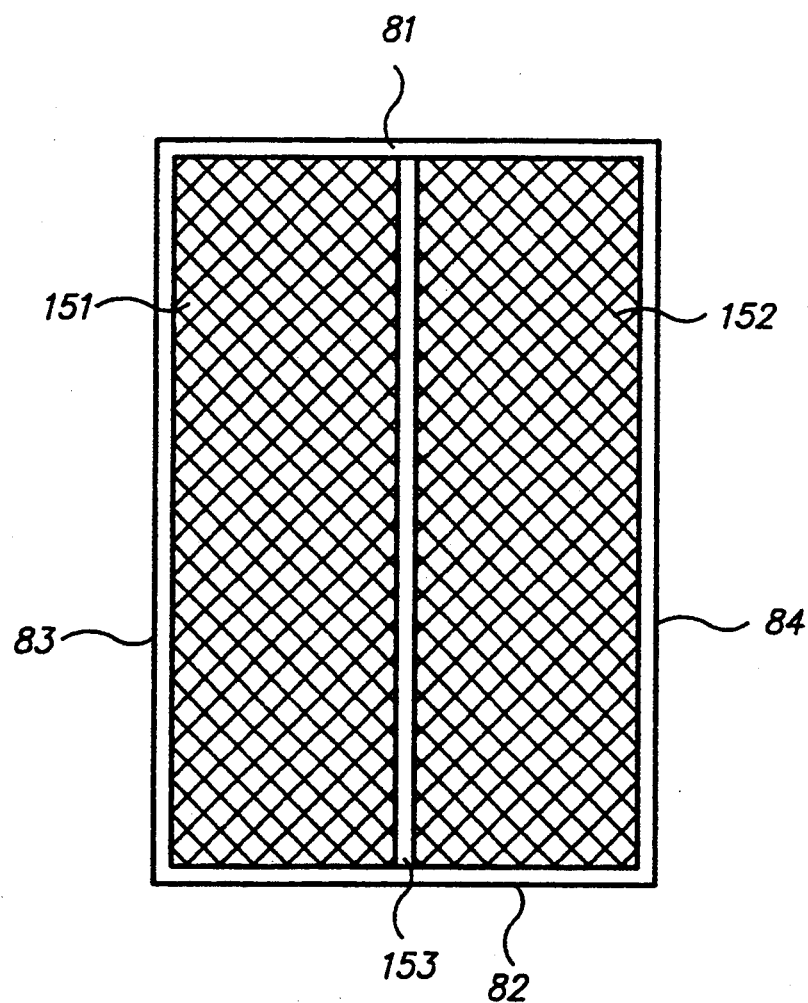
FIG. 14 is a preferred embodiment of an optimized mode selection sensor for detecting the fifth bending mode of a small slider.
Figure 14B:
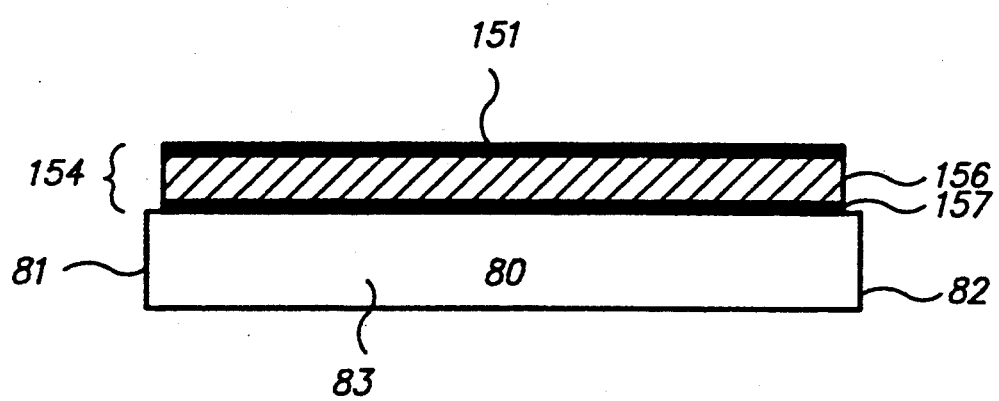

In the event that none of the isolated bending mode components displays monotonic behavior with increasing asperity interference, other bending modes may be analyzed by replacing the two-region mode selection sensor with the four-quadrant embodiment or a two region mode selection sensor such as that shown in FIGS. 14(a)-(b). The embodiment of FIGS. 14(a)-(b) is similar to that of FIG. 7, comprising a sensor 154 mounted on a slider 80. The sensor 154 includes a slab of piezoelectric material 156 such as PZT-5A, an upper layer of conductive material is split into two regions 151, 152 which are coupled to two ports 121, 122 of a charge amplifier (FIG. 9), and an electrically grounded lower layer of conductive material 157. But in contrast to the sensor of FIG. 7, a longitudinal groove 153 divides the conductive upper layer 155 along the slider's longitudinal axis, rather than along its lateral axis, thereby defining hub and rail regions 151, 152. The hub and rail regions 151, 152 are referred to as H and R for convenience. By subtracting the hub signal from the rail signal (R−H) and taking the power spectrum of the resulting signal, the bending mode component characterized by FIG. 5(d) is obtained. The bending mode components characterized by FIGS. 5(b) and (c) are similarly isolated by summing the signals (R+H). To obtain the bending mode component corresponding to FIG. 5(a), however, the four-quadrant mode selection sensor of FIG. 6 is required.

Figure 16A:
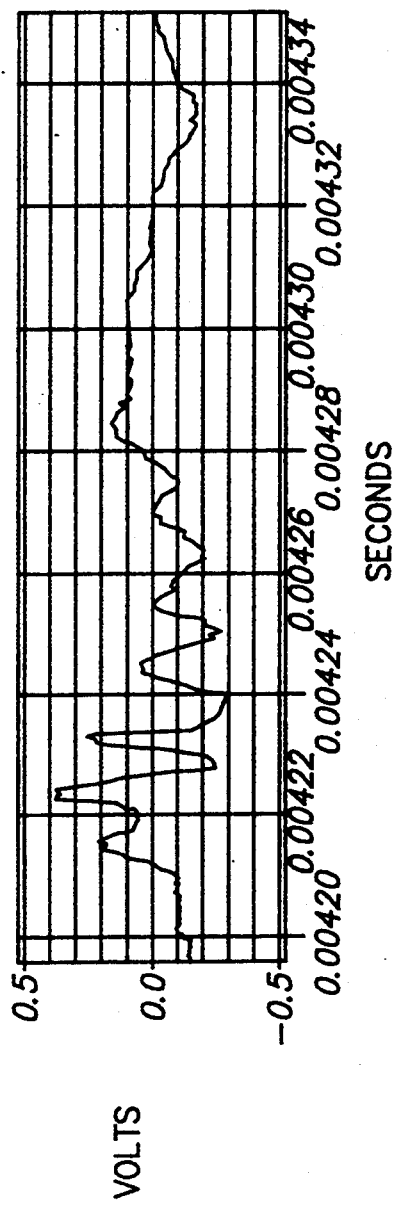
FIGS. 16(a)-(c) represent the small slider response to asperity contact, the power spectrum of the response using a 1.0-1.4 Mhz filter, and the power spectrum of the slider response using a wide-band filter.
Figure 16B:
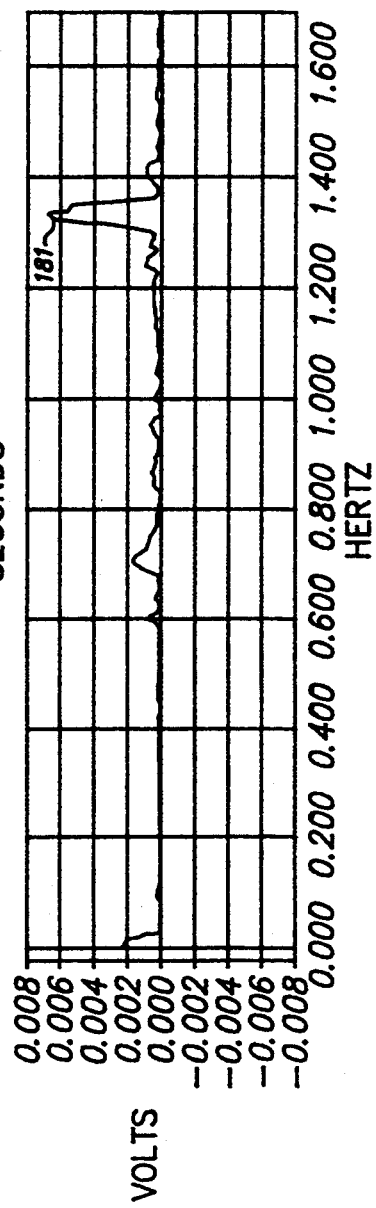
Figure 16C:
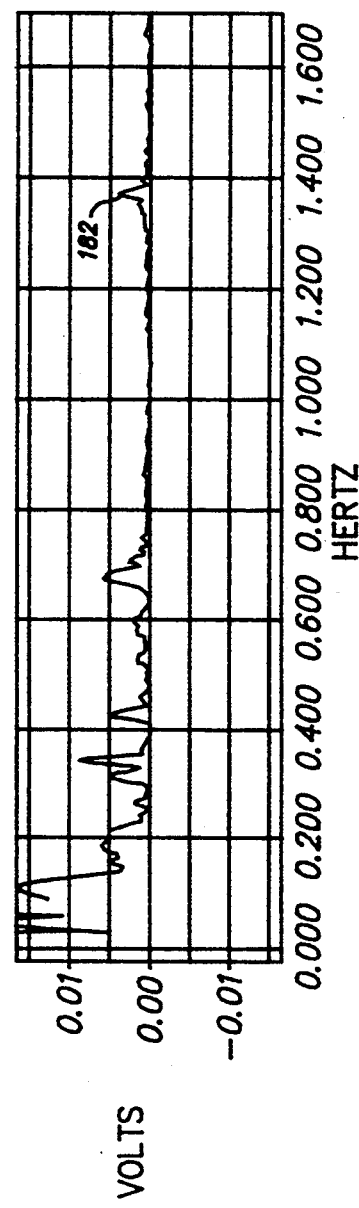

The mode selection sensor of the present invention was optimized using the two-region mode selection sensor of FIG. 7. FIG. 16(a) shows the slider response obtained by subtracting the signal responses from each region. The power spectra of the processed responses are shown in FIGS. 16(b) and (c). The waveform in FIG. 16(b) was obtained using a 1.0–1.4 MHz filter. Peak 181 indicates a bending mode frequency of approximately 1.35 MHz. The waveform in FIG. 16(c) is the power spectrum obtained with a wide-band filter showing a peak 182 at about 1.37 MHz. The bending mode frequencies corresponding to FIGS. 5(b) and (c) were obtained by summing the responses from each half of the sensor (not shown).

III. Selecting A Monotonic Response

Once the bending mode frequencies have been identified, each is studied by the same signal processing means described above to determine whether any identified mode has a monotonic response with increasing asperity interference. This analysis may be accomplished in a number of ways. For example, the slider's response to contact with a plurality of asperities may be analyzed during a disk spindown. In a preferred method, the slider's response contact with a single asperity is studied over a range of increasing or decreasing interference heights.

Figure 15:
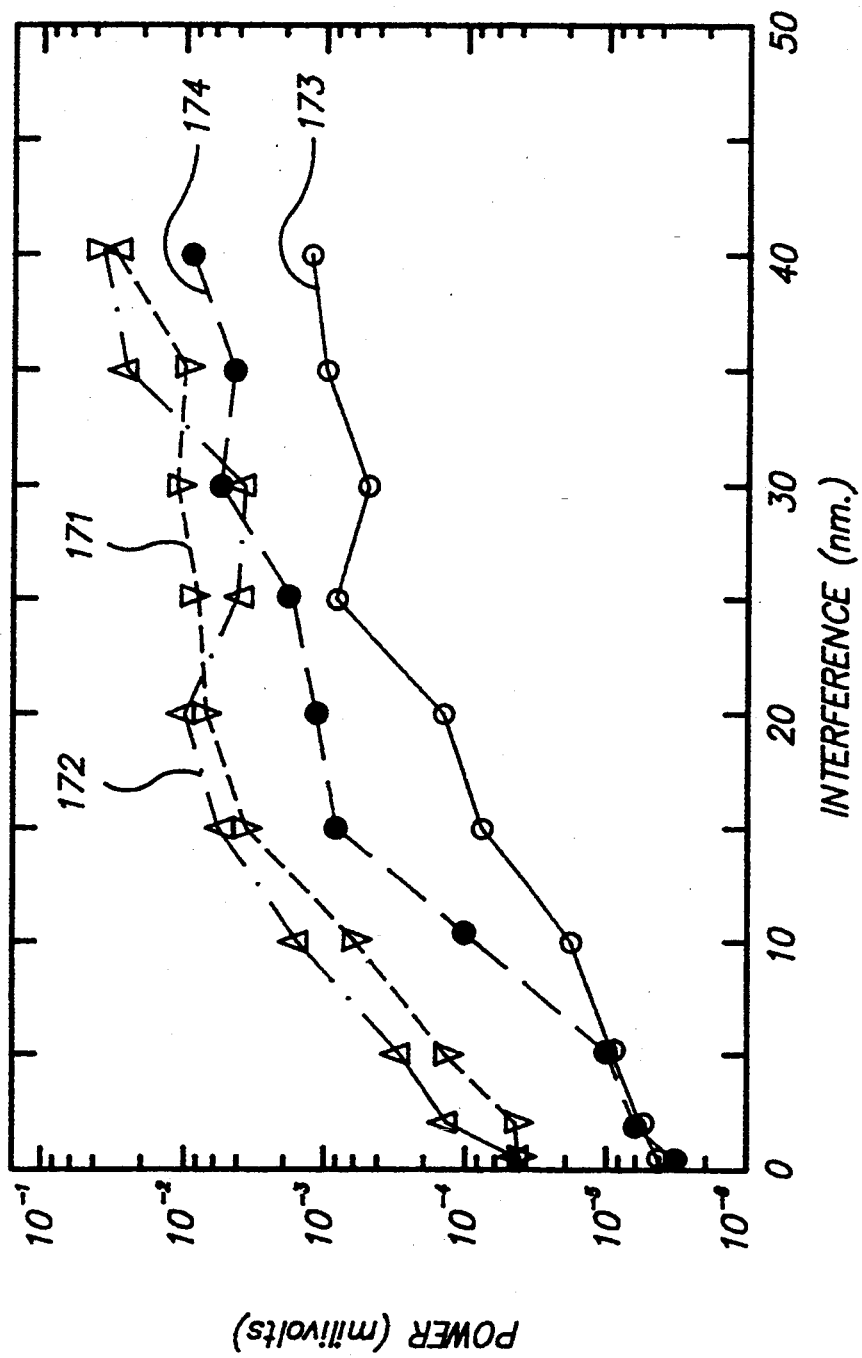
FIG. 15 is a graphical representation of the slider modal responses for increasing slider interference heights.

As an example of the latter method, a slider mounted with the mode selection sensor of FIG. 7 was suspended over a magnetic recording disk as shown in FIG. 8. FIG. 15 shows the results obtained for the low order bending modes by plotting the signal power of the slider response (in millivolts) versus asperity interference height. The response corresponding to the slider vibration modes of FIGS. 5(b) 171 (the second lowest order bending mode for this slider), (c) 172 (the third bending mode) and (e) 173, 174 (the fifth and seventh bending modes) are shown. In the preferred "single asperity contact analysis", a spectrum analyzer is used to distinguish the contribution of each bending mode frequency in the slider response.

For the sensor of the present invention, a small tri-rail slider was mounted with the two-quadrant sensor of FIG. 7, and a series of spin-downs were performed. The response of the bending mode components characterized by FIGS. 5(b) and (c) were monitored in relation to increasing asperity interference by summing the signals (LE+TE). Subsequently, the bending mode component characterized by FIG. 5(e) was observed for increasing asperity interference by subtracting the signals (LE−TE).

Figure 17:
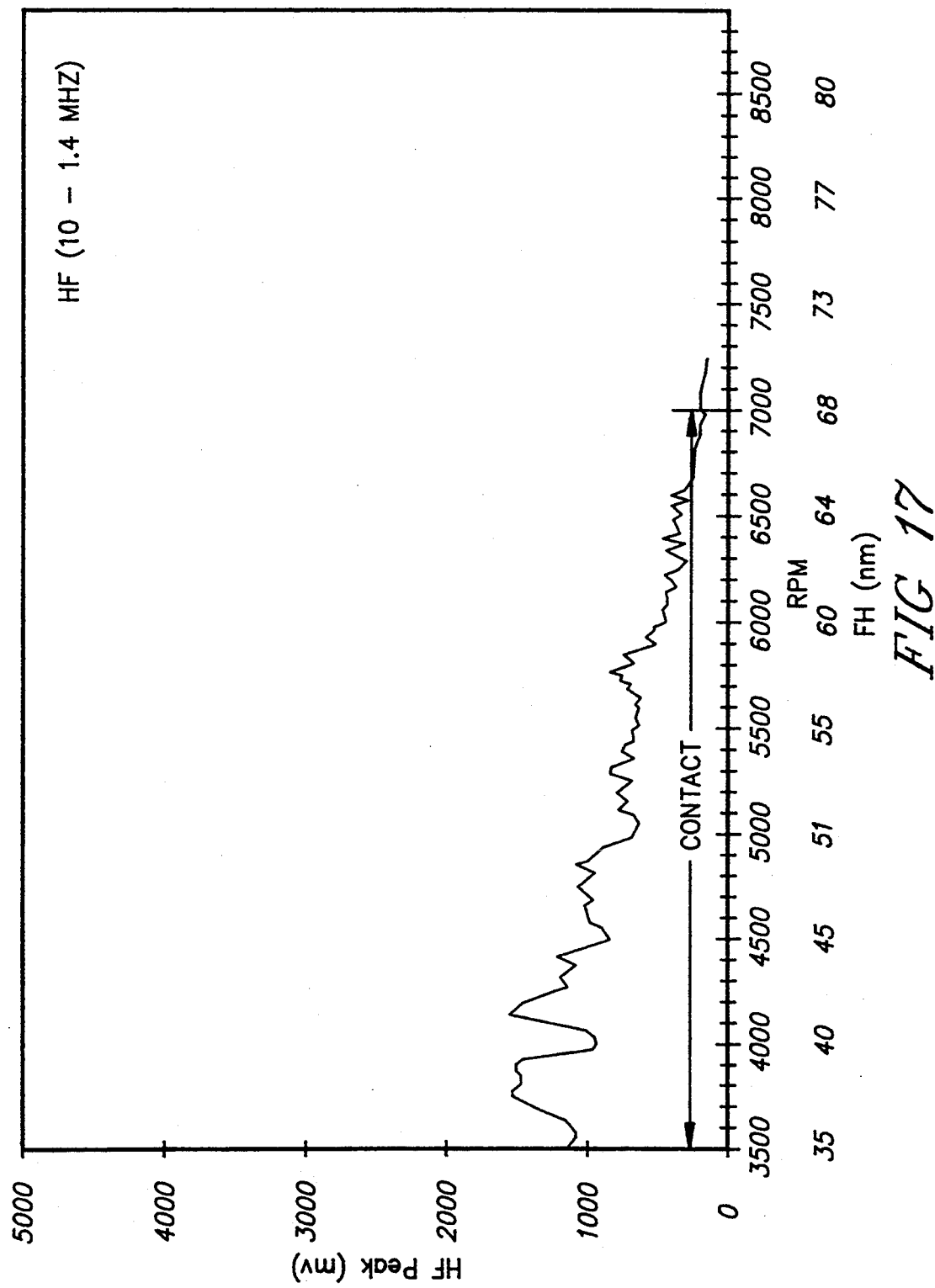
FIG. 17 is a graph of the slider responses to decreasing asperity interference obtained during a spin-down test.

The bending mode frequency represented in FIG. 5(e) was experimentally found to be the most suitable candidate for contact detection using a 100% conventional slider. It was also found to behave monotonically for a small, (e.g. 2.5 mm long by 1.7 mm wide) $< =62\%$ tri-rail slider. FIG. 17 shows the spin-down test results obtained for this 62% small slider by monitoring the bending mode frequency identified at approximately 1.0-1.4 MHz. To be certain that this bending mode was the optimal choice for the smaller slider, spin-down tests were repeated using the two-quadrant sensor of FIG. 14. Use of the alternative sensor permitted observation of the additional bending mode represented in FIG. 5(d). That mode proved to have less desirable characteristics than the one of FIG. 5(e). It should be understood that the method of the present invention is applicable to air-bearing and contact sliders of all dimensions and rail configurations, and that the most suitable bending mode frequencies will vary with slider characteristics.

IV. Designing the Optimized Sensor

Figure 18:
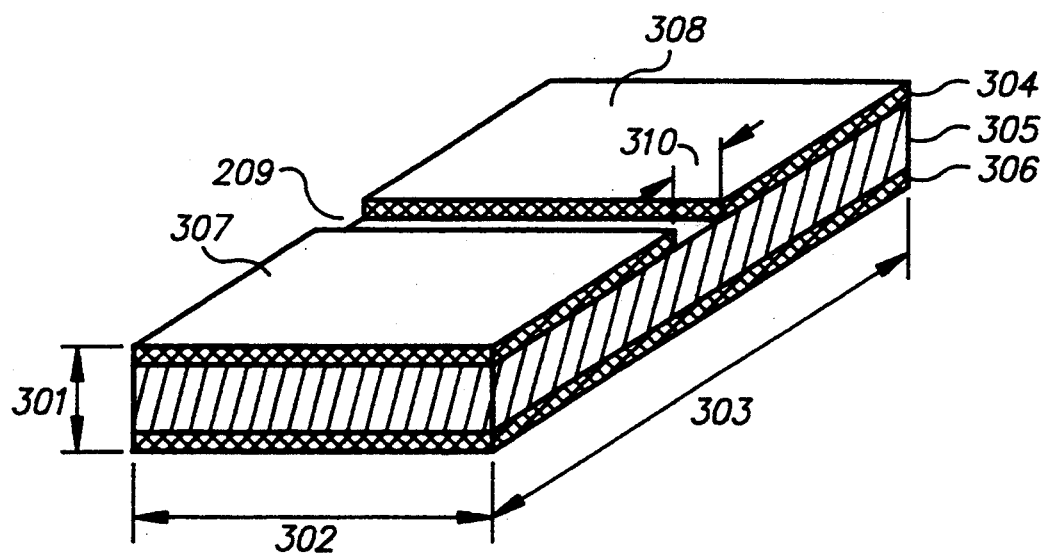
FIG. 18 is an orthogonal view of the two-region mode selection sensor for a small slider according to the present invention.

Once the most desirable bending mode or modes have been identified for a given slider size, the modal stress distribution symmetries shown in FIGS. 5(a)-(e) are used to select a sensor design which facilitates isolation of the particular mode(s) of interest, while eliminating the contributions of other modes. For example, the optimized sensor design for a $<62\%$ is shown in FIG. 18. One may i, observe, by revisiting FIG. 5(e), that the sensor of FIG. 18 is tailored to match the symmetry of that particular bending mode frequency response. The sensor comprises a slab of piezoelectric material 305 such as PZT-5A having upper and lower conductive layers 304, 306. The lower conductive layer 306 is continuous and grounded to port 120 of FIG. 9; e.g. via suspension wire or other connective means to an amplifier ground port 120 (FIG. 9). The upper conductive layer 304 comprises two electrically isolated regions 307 which are connected to a port 121 with switch 133 set for a positive sum and region 308 connected to a port 122 with switch 134 set for a negative sum. Preferably, the regions are formed by first applying a continuous layer of conductive material such as nickel to the upper surface of the piezoelectric layer 305, and then etching a lateral groove 309 (e.g. by chemical etching, laser etching, reactive ion etching (RIE) or laser ablation) through the conductive layer and a portion of the slab 305. The sensor is mounted to a slider by conventional means such as bonding with an epoxy.

Figure 19:
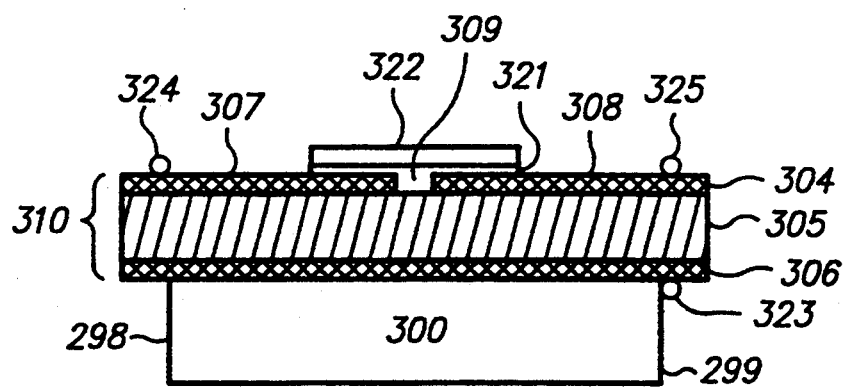
FIG. 19 is a side view of an assembly including the sensor of FIG. 18 mounted to a slider and suspension arm.

The two-region sensor design facilitates subtraction of the signals generated by the two regions 307, 308 for the detection of the desired 1.0-1.4 MHz bending mode frequency response. All lower order modes are eliminated during the subtraction. In the preferred embodiment, the sensor has a length 303 of 3.1-3.3 mm, a width 302 of 1.65-1.7 mm, and a thickness 301 of 0.19 mm. When mounted on a small slider 300, the sensor overhangs the slider's leading and trailing edges 299, 298 as shown in FIG. 19. Overhanging permits electrical access to the lower conductive layer 306 by suspension wire 323. Each of the regions 307, 308 of the upper conductive layer and lower conductive layer 304, 306 are connected by suspension wires 324, 325 and 323 to the input ports and ground port of a change amplifier, respectively. (see FIG. 9).

Figures 20A, 20B:
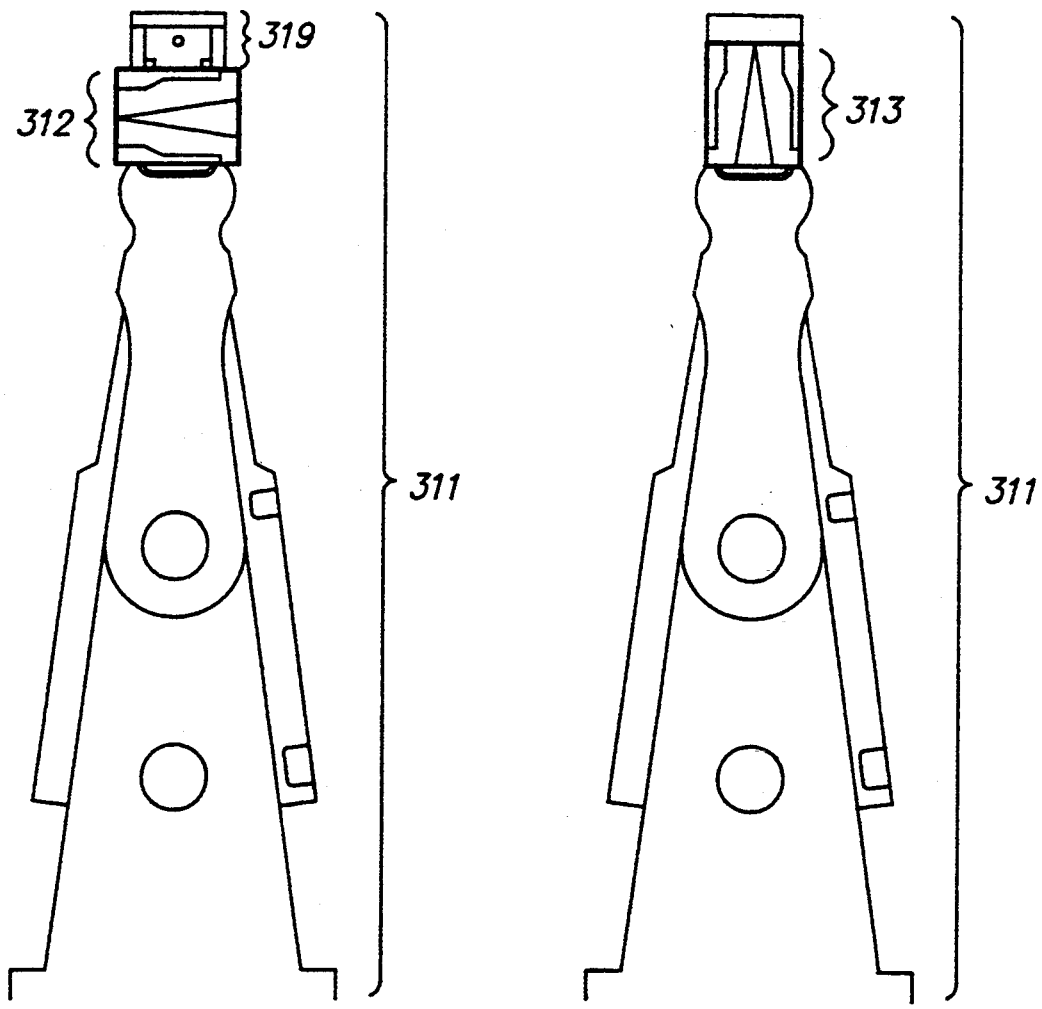
FIG. 20(a) illustrates a small slider mounted orthogonally on a suspension arm.
FIG. 20(b) illustrates a small slider mounted "in line" on a suspension arm.

In FIG. 19, the sensor/slider structure 310 of the preferred embodiment is orthogonally mounted on a suspension arm 311 as shown in FIG. 20(a). Alternatively, an "in-line" arrangement such as that of FIG. 20(b) can be accommodated. Referring back to FIG. 19, the slider and sensor are bonded to the suspension 322 with a nonconductive bond to preserve the electrical isolation of the regions 307, 308 from conductive suspension material. In the preferred method, an epoxy is prepared by first filtering quartz beads to obtain homogenous particles measuring approximately 25 microns in diameter. The amorphous quartz beads are added to a standard non-conductive epoxy such as LR559 manufactured by HYSOL. The quartz beads of the mixture assure a separation between the conductive upper regions 307, 308 and the bonded suspension 322 of about 25 microns.

Although the invention has been described with reference to specific embodiments, it should be understood that numerous substitutions and variations can be made in the optimization process, the mode selection sensor design, fabrication and assembly without departing from the nature and scope of the present invention which is set forth in the following claims. In particular, this piezoelectric sensor design can be used with any size slider less than the convention 100% slider size.

We claim:

1. A method for making a mode selection sensor, comprising the steps of:
   forming a piezoelectric sensor, comprising a slab of piezoelectric material having upper and lower conductive layers;
   cutting a groove through said upper layer of conductive material to form first and second electrically isolated regions; and
   bonding said lower layer of conductive material onto a slider having first and second side edges, wherein said sensor overhangs said first and second side edges of said slider to expose first and second portions of said lower conductive surface.

2. The method of claim 1, further comprising the step of grounding said lower conductive layer via one of said exposed first and second portions.

3. The method of claim 2, further comprising the steps of electrically coupling said first and second electrically isolated regions to an amplifier.

4. The method of claim 3, further comprising the step of bonding the flexure of a suspension arm to said upper conductive layer.

5. The method of claim 4, wherein said slider is orthogonally positioned with respect to said suspension arm.

6. The method of claim 5, wherein said flexure is centrally disposed over said groove.

7. The method of claim 6, wherein said flexure is bonded to said upper conductive layer using a nonconducting epoxy mixture comprising approximately 20% homogeneous quartz beads and approximately 80% epoxy.

8. The method of claim 1, wherein said groove is cut by laser etching, chemical etching or reactive ion etching.

9. The method of claim 1, wherein said slab is substantially rectangular and wherein said first and second electrically isolated regions are symmetrical about the lateral axis of said slab.

10. The method of claim 1, wherein said slider comprises a slider of dimensions smaller than a 100% slider.

11. The method of claim 1, wherein said slider comprises a slider having one of the following sizes with respect to a 100% slider: 70%, 63%, 62%, 50%, 33% and 25%.

12. The method of claim 1, wherein said piezoeletric material comprises PZT-5A.

13. A mode selection sensor comprising:
a slider having first and second side edges; and
a piezoelectric sensor, comprising a slab of piezoelectric material including an upper and a lower conductive layer, wherein said upper conductive layer is partitioned to provide first and second electrically isolated sensor regions, wherein said lower conductive layer is bonded to said slider, and wherein said sensor overhangs said first and second side edges of said slider to expose first and second portions of said lower conductive surface.

14. The mode selection sensor of claim 13, wherein said slab is substantially rectangular, and wherein said first and second electrically isolated sensor regions are symmetrical about the lateral axis of said slab.

15. The mode selection sensor of claim 13, further including means for electrically coupling each of said first and second electrically isolated regions to an amplifier, and means for grounding said lower conductive layer via one of said first and second portions.

16. The mode selection sensor of claim 13, wherein said slider comprises a slider of smaller dimensions than a 100% slider.

17. The mode selection sensor of claim 13, wherein said slider comprises a slider having one of the following sizes with respect to a 100% slider: 70%, 63%, 62%, 50%, 33% and 25%.

18. The mode selection sensor of claim 13, wherein said piezoelectric layer comprises PZT-5A.

19. The mode selection sensor of claim 13, wherein said first and second electrically isolated sensor regions are formed by etching a groove through said second layer of conductive material.

20. The mode selection sensor of claim 15, further comprising a suspension arm flexure bonded to said upper conductive layer.

21. The mode selection sensor of claim 20, wherein said slider is orthogonally positioned with respect to said suspension arm.

22. The mode selection sensor of claim 21, wherein said suspension arm flexure is centrally disposed over said groove.

23. The mode selection sensor of claim 22, wherein said flexure is bonded to said upper conductive layer using a nonconducting epoxy mixture comprising approximately 20% homogeneous quartz beads and approximately 80% epoxy.

24. Surface analysis apparatus comprising:
a slider including first and second side edges;
a piezoelectric sensor for generating first and second response signals, comprising,
a slab of piezoelectric material including an upper and a lower conductive layer, wherein said upper conductive layer is partitioned to provide first and second electrically isolated sensor regions, wherein said lower conductive layer is bonded to said slider, and wherein said sensor overhangs said first and second side edges of said slider to expose first and second portions of said lower conductive surface;
means for suspending said slider over a relatively moving surface;
a signal processing circuit for receiving said first and second response signals to isolate a predetermined bending mode frequency response; and
means for providing said first and second response signals to said signal processing circuit.

25. The apparatus of claim 24, wherein said piezoelectric material is PZT-5A.

26. The apparatus of claim 24, wherein said slider is a slider of dimensions smaller than a 100% slider.

27. The apparatus of claim 24, wherein said slider has one of the following dimensions with respect to a 100% slider: 70%, 63%, 62%, 50%, 33% and 25%.

28. The apparatus of claim 24, wherein said first and second electrically isolated sensor regions are formed by etching a groove through said upper layer of conductive material.

29. The apparatus of claim 24, wherein said slab is substantially rectangular, and wherein said first and second electrically isolated sensor regions are symmetrical about the lateral axis of said slab.

30. The apparatus of claim 29, wherein said signal processing circuit further comprises means for subtracting said second response signal from said first response signal to obtain said predetermined bending mode frequency response.

31. The apparatus of claim 29, wherein said signal processing circuit further comprises means for adding said first and second response signals to obtain said predetermined bending mode frequency response.

32. The apparatus of claim 24, wherein said means for providing said first and second response signals to said signal processing circuit further comprises means for electrically coupling each of said electrically isolated regions to an amplifier, and means for grounding said lower conductive layer via one of said first and second portions.

33. A method for analyzing a mechanical surface, comprising the steps of:
suspending a mode selection sensor over a surface including at least one asperity, said mode selection sensor comprising a slider having first and second side edges, and a slab of piezoelectric material having upper and lower conductive layers, wherein said upper conductive layer is partitioned to provide first and second electrically isolated sensor regions, wherein said lower conductive layer is bonded to said slider, and wherein said sensor overhangs said first and second side edges of said slider to expose first and second portions of said lower conductive surface;
providing relative motion between said sensor and said surface;
detecting first and second response signals generated in said first and second electrically isolated sensor regions, respectively; and
processing said first and second response signals to obtain a predetermined bending mode frequency response.

34. The method of claim 33, wherein said slab is substantially rectangular, and wherein said first and second electrically isolated sensor regions are symmetrical about the lateral axis of said slab.

35. The method of claim 34, wherein said processing further comprises the step of subtracting said second response signal from said first response signal to obtain said predetermined bending mode frequency response.

36. The method of claim 35, wherein said processing further comprises the step of adding said first and second response signals to obtain said predetermined bending mode frequency response.

37. The method of claim 33, further comprising a signal processing circuit with means for electrically coupling each of said electrically isolated regions to an amplifier, and means for grounding said lower conductive layer via one of said first and second portions.

* * * * *